United States Patent
Asano et al.

(10) Patent No.: US 8,004,908 B2
(45) Date of Patent: Aug. 23, 2011

(54) DOUBLE EDGE TRIGGERED FLIP-FLOP CIRCUIT

(75) Inventors: Takashi Asano, Gifu (JP); Kouichi Yamada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 142 days.

(21) Appl. No.: 12/519,255

(22) PCT Filed: Sep. 17, 2008

(86) PCT No.: PCT/JP2008/002560
§ 371 (c)(1),
(2), (4) Date: Jun. 15, 2009

(87) PCT Pub. No.: WO2009/037831
PCT Pub. Date: Mar. 26, 2009

(65) Prior Publication Data
US 2010/0034030 A1   Feb. 11, 2010

(30) Foreign Application Priority Data

Sep. 19, 2007   (JP) .................................. 2007-242807
Sep. 19, 2007   (JP) .................................. 2007-242808

(51) Int. Cl.
*G11C 7/10*   (2006.01)
(52) U.S. Cl. .................................. 365/189.05; 365/154
(58) Field of Classification Search ............. 365/189.05, 365/154, 230.08
See application file for complete search history.

(56) References Cited

U.S. PATENT DOCUMENTS

| 4,873,456 | A | * | 10/1989 | Olisar et al. | 327/202 |
| 5,396,169 | A | * | 3/1995 | Buehler et al. | 324/762.01 |
| 5,844,844 | A | * | 12/1998 | Bauer et al. | 365/189.05 |
| 6,445,217 | B1 | * | 9/2002 | Kojima et al. | 327/57 |
| 7,679,401 | B1 | * | 3/2010 | Redgrave | 326/40 |

FOREIGN PATENT DOCUMENTS

| JP | 02-027811 | 1/1990 |
| JP | 03-262317 | 11/1991 |
| JP | 7-095013 | 4/1995 |
| JP | 08-256044 | 10/1996 |

OTHER PUBLICATIONS

International Search Report issued in International Patent Application No. PCT/JP2008/002560, dated Oct. 14, 2008.
Written Opinion of the International Searching Authority issued in International Patent Application No. PCT/JP2008/002560, dated Oct. 14, 2008.

* cited by examiner

*Primary Examiner* — Vu A Le
(74) *Attorney, Agent, or Firm* — McDermott Will & Emery LLP

(57) ABSTRACT

In a double edge triggered flip-flop circuit, a first latch circuit latches input data at either one of rising edge and falling edge of clock signal. A second latch circuit, which is provided in parallel with the first latch circuit, latches the input data at the other of the either one of rising edge and falling edge of the clock signal. At least one of the first latch circuit and the second latch circuit is configured by an SRAM (Static Random Access Memory) type.

16 Claims, 14 Drawing Sheets

DOUBLE EDGE TRIGGERED FLIP-FLOP CIRCUIT

RELATED APPLICATIONS

This application is the U.S. National Phase under 35 U.S.C. §371 of International Application No. PCT/JP2008/002560, filed on Sep. 17, 2008, which in turn claims the benefit of Japanese Application No. 2007-242807, filed on Sep. 19, 2007 and Japanese Application No. 2007-242808, filed on Sep. 19, 2007, the disclosures of which Applications are incorporated by reference herein.

BACKGROUND OF THE INVENTION

1. Field of the Invention

The present invention relates to a double edge triggered flip-flop circuit.

2. Description of the Related Art

Various types of digital equipment, such as digital audio players, have been in widespread use, and the demand for LSIs (Large Scale Integration) used for digital signal processing is ever growing. On such LSIs, a great number of flip-flop circuits are mounted as fundamental elements of sequential circuits.

While energy conservation is being promoted, the reduction in power consumption of LSIs has been long called for. From the viewpoint of extending battery life, the reduction in power consumption is required for LSIs mounted on battery-powered equipment represented by mobile equipment.

20% to 45% of electric power consumed within the LSI is consumed as power for the charging and discharging of capacitances by clock signals. Thus, the reduction in power consumed by the charging and discharging will be effective in the reduction of power consumption of LSI. A double edge triggered flip-flop circuit is proposed as a means for reducing the power consumption due to the transition of clock signal.

A double edge triggered flip-flop circuit includes two latch circuits arranged in parallel with each other. One of the two latch circuits latches input data at rising edge of clock signal, whereas the other latch circuit latches the input data at falling edge of clock signal. The double edge triggered flip-flop circuit can achieve the same operation speed at a clock frequency half that used in a single edge triggered flip-flop. Since the clock frequency is halved, the power consumed by the clock signal can be reduced to a half.

A large number of transistors that turn on and off by the clock signal need to be provided in the double edge triggered flip-flop circuit. As a result, the power for the charging and discharging of capacitances by the clock signal increases. Also, a plurality of latch circuits need to be provided in the double edge triggered flip-flop circuit, thereby increasing the circuit area.

SUMMARY OF THE INVENTION

A flip-flop circuit according to one embodiment of the present invention comprises: a first latch circuit which latches input data at either one of rising edge and falling edge of clock signal; and a second latch circuit, provided in parallel with the first latch circuit, which latches the input data at the other of the either one of rising edge and falling edge of the clock signal, wherein at least one of the first latch circuit and the second latch circuit is configured by an SRAM type.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

Figure 1:
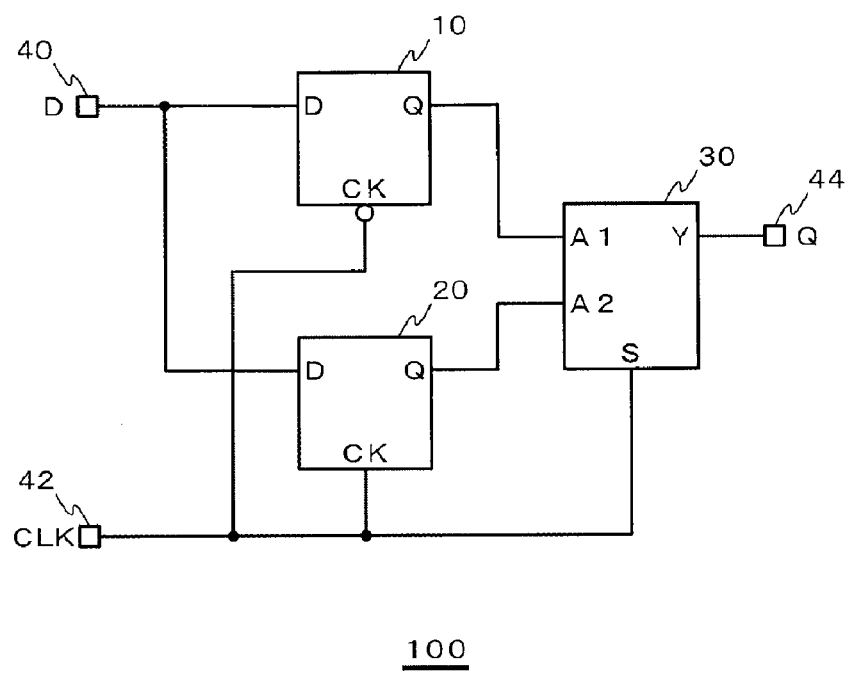
FIG. 1 is a block diagram showing a basic configuration of a double edge triggered flip-flop circuit.

The present invention is described based on the following preferred embodiments with reference to drawings. The same or equivalent components, members and processings shown in Figures are given the identical reference numerals and the repeated description thereof will be omitted as appropriate. The following embodiments do not intend to limit the scope of the present invention but exemplify the invention, and all of the features and the combinations thereof described in the embodiments are not necessarily essential to the invention.

FIG. 1 is a block diagram showing a basic configuration of a double edge triggered flip-flop circuit 100. This flip-flop circuit 100 includes a first latch circuit 10, a second latch circuit 20, and a multiplexer 30. As input/output terminals, the flip-flop circuit 100 includes an input terminal 40 to which input data D are inputted, a clock terminal 42 to which a clock signal CLK is inputted, and an output terminal 44 from which output data Q are outputted.

In the following explanation, assume that the amplitude of input data D is designed such that a low level thereof is ground potential as a low-potential-side fixed voltage source and a high level thereof is power supply potential Vdd as a highpotential-side fixed voltage source. Similarly, the amplitude of clock signal CLK and that of inverted clock signal CLKB are designed such that a low level thereof is ground potential as a low-potential-side fixed voltage source and a high level thereof is power supply potential Vdd as a high-potential-side fixed voltage source.

The first latch circuit 10 and the second latch circuit 20 are provided, in parallel with each other, between the input terminal 40 and the multiplexer 30. The first latch circuit 10 and the second latch circuit 20 are controlled in such a manner that an active state and an inactive state are repeated alternately and, at the same point in time, either one of the first latch circuit 10 and the second latch circuit 20 is in an activation period and the other in an inactivation period. Here, the activation period is a period during which the latched data are retained regardless of the input data D, whereas the inactivation period is a period during which to follow the input data D. Thus, the activation period and the inactivation period may be replaced by the active state and the inactive state, respectively.

In the flip-flop circuit 100 as shown in FIG. 1, the first latch circuit 10 latches the input data D at rising edge of the inverted clock signal CLKB, namely, at falling edge of clock signal CLK. The second latch circuit 20 latches the input data D at rising edge of clock signal CLK. As a result, the input data D can be latched at both rising edge and falling edge of clock signal CLK.

The multiplexer 30 outputs selectively the output data of the first latch circuit 10 and the output data of the second latch circuit 20 in response to the clock signal CLK.

Figure 2:
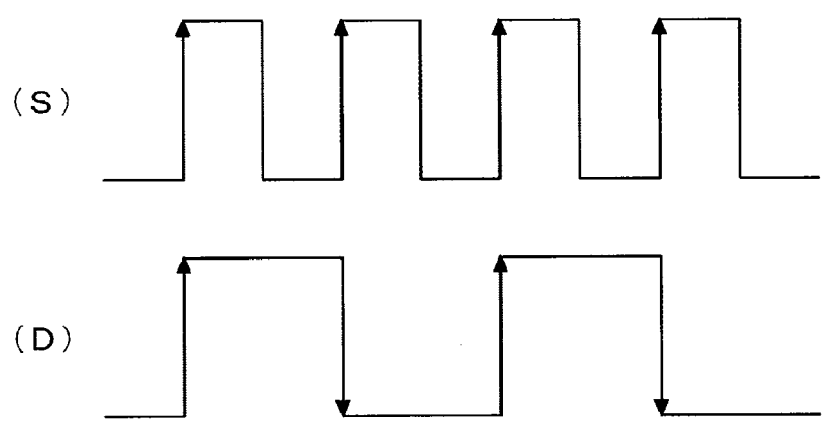
FIG. 2 is a diagram where a clock signal (S) supplied to a single edge triggered flip-flop circuit and a clock signal (D) supplied to a double edge triggered flip-flop circuit are compared with each other.

FIG. 2 is a diagram where a clock signal (S) supplied to a single edge triggered flip-flop circuit and a clock signal (D) supplied to a double edge triggered flip-flop circuit are compared with each other. In FIG. 2, the rising edge of the former clock signal (S) is the latch timing, whereas both the rising edge and the falling edge of the latter clock signal (D) are the latch timing. Thus, the double edge triggered flip-flop circuit can achieve the same operation speed at a frequency half that used in the single edge triggered flip-flop circuit.

Figure 3:
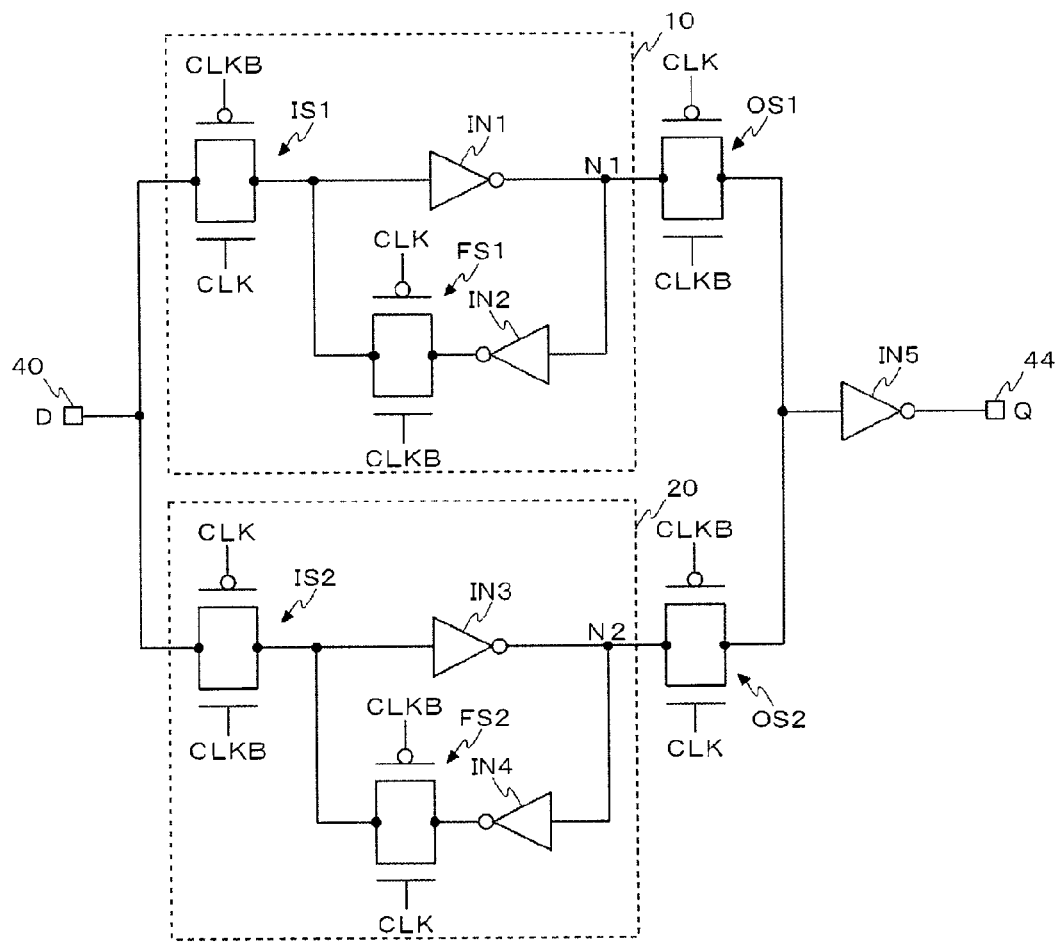
FIG. 3 is a circuit diagram showing a configuration of a commonly-used double edge triggered flip-flop circuit.

FIG. 3 is a circuit diagram showing a configuration of a commonly-used double edge triggered flip-flop circuit 100. This flip-flop circuit 100 includes a first latch circuit 10, a second latch circuit 20, a first output switch OS1, a second output switch OS2, and a fifth inverter IN5. The first output switch OS1 and the second output switch OS2 achieve the function of the multiplexer 30 as shown in FIG. 1. The first output switch OS1 is connected to an output terminal of the first latch circuit 10, whereas the second output switch OS2 is connected to an output terminal of the second latch circuit 20.

The fifth inverter IN5 is provided to output the input data D in phase. Here, the input data D are inputted or latched into the first latch circuit 10 and the second latch circuit 20. If the input data D inputted or latched into the first latch circuit 10 and the second latch circuit 20 are to be outputted in reverse phase, there will be no need to provide the fifth inverter IN5. Note that a configuration may be such that both output data Q and the inverted output data with reverse phase are outputted.

The first latch circuit 10 latches the input data D at either one of rising edge and falling edge of clock signal. The first latch circuit 10 includes a first inverter IN1, a second inverter IN2, a first input switch IS1, and a first feedback switch FS1.

The first input switch IS1 is connected to an input terminal of the first inverter IN1. The first inverter IN1, which receives the input data D, inverts the input data D and outputs the inverted input data. The second inverter IN2, which receives the output data of the first inverter IN1, inverts the output data and feeds back the inverted output data to the input of the first inverter IN1. The first feedback switch FS1 is provided between the output terminal of the second inverter IN2 and the input terminal of the first inverter IN1.

The second latch circuit 20, which is provided in parallel with the first latch circuit 10, latches the input data D at the other of either one of rising edge and falling edge of clock signal. The second latch circuit 20 includes a third inverter IN3, a fourth inverter IN4, a second input switch IS2, and a second feedback switch FS2.

The second input switch IS2 is connected to an input terminal of the third inverter IN3. The third inverter IN3, which receives the input data D, inverts the input data D and outputs the inverted input data. The fourth inverter IN4, which receives the output data of the third inverter IN3, inverts the output data and feeds back the inverted output data to the input of the third inverter IN3. The second feedback switch FS2 is provided between the output terminal of the fourth inverter IN4 and the input terminal of the third inverter IN3.

The first input switch IS1, the second input switch IS2, the first output switch OS1, the second output switch OS2, the first feedback switch FS1 and the second feedback switch FS2 are each configured by a complementary switch. The complementary switch is configured by a combination of an N-channel transistor (hereinafter denoted by "Nch transistor") and a P-channel transistor (hereinafter denoted by "Pch transistor"). A MOSFET (Metal Oxide Semiconductor Field Effect Transistor) is used for these transistors. The complementary switch utilizes the fact that the characteristics of increase in ON-resistance of the Nch transistor to an input voltage level are opposite to the characteristics of increase in ON-resistance of the Pch transistor thereto. With the use of the complementary switch, the restrictions on the threshold voltage of the transistors can be eased and the unsharpness of the output voltage level can be suppressed.

In the flip-flop circuit 100 shown in FIG. 3, when the first latch circuit 10 is controlled to remain in an active state and the second latch circuit 20 is controlled to remain in an inactive state, the first input switch IS1, the second output switch OS2 and the second feedback switch FS2 are controlled to OFF and the second input switch IS2, the first output switch OS1 and the first feedback switch FS1 are controlled to ON by the clock signal CLK and the inverted clock signal CLKB.

On the other hand, when the first latch circuit 10 is controlled to remain in an inactive state and the second latch circuit 20 is controlled to remain in an active state, the first input switch IS1, the second output switch OS2 and the second feedback switch FS2 are controlled to ON and the second input switch IS2, the first output switch OS1 and the first feedback switch FS1 are controlled to OFF by the clock signal CLK and the inverted clock signal CLKB.

Figure 4:
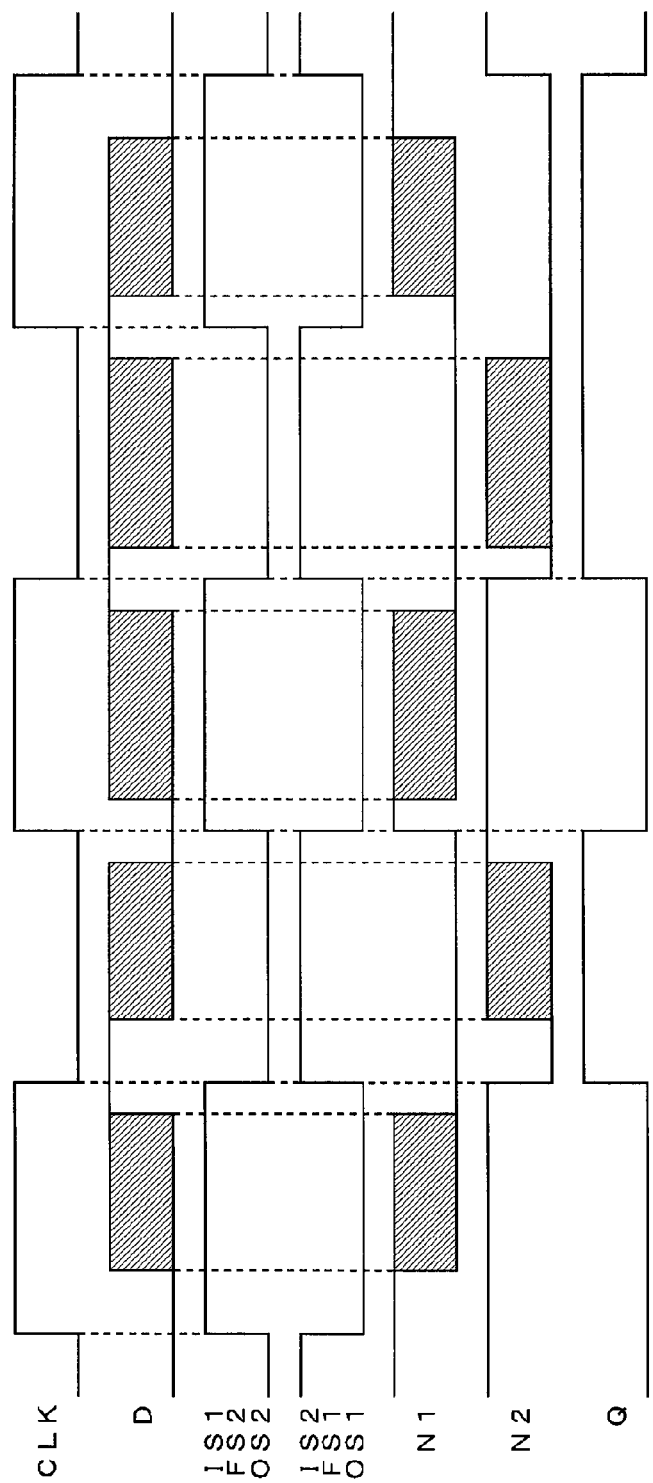
FIG. 4 is a timing chart showing an exemplary operation of the flip-flop circuit shown in FIG. 3.

FIG. 4 is a timing chart showing an exemplary operation of the flip-flop circuit 100 shown in FIG. 3. It is observed from FIG. 4 that when the clock signal CLK goes high, the input data D are latched by the first latch circuit 10 and then the data latched in the second latch circuit 20 are outputted. On the other hand, it is observed that when the clock signal CLK goes low, the input data D are latched by the second latch circuit 20 and then the data latched in the first latch circuit 10 are outputted.

Figure 5:
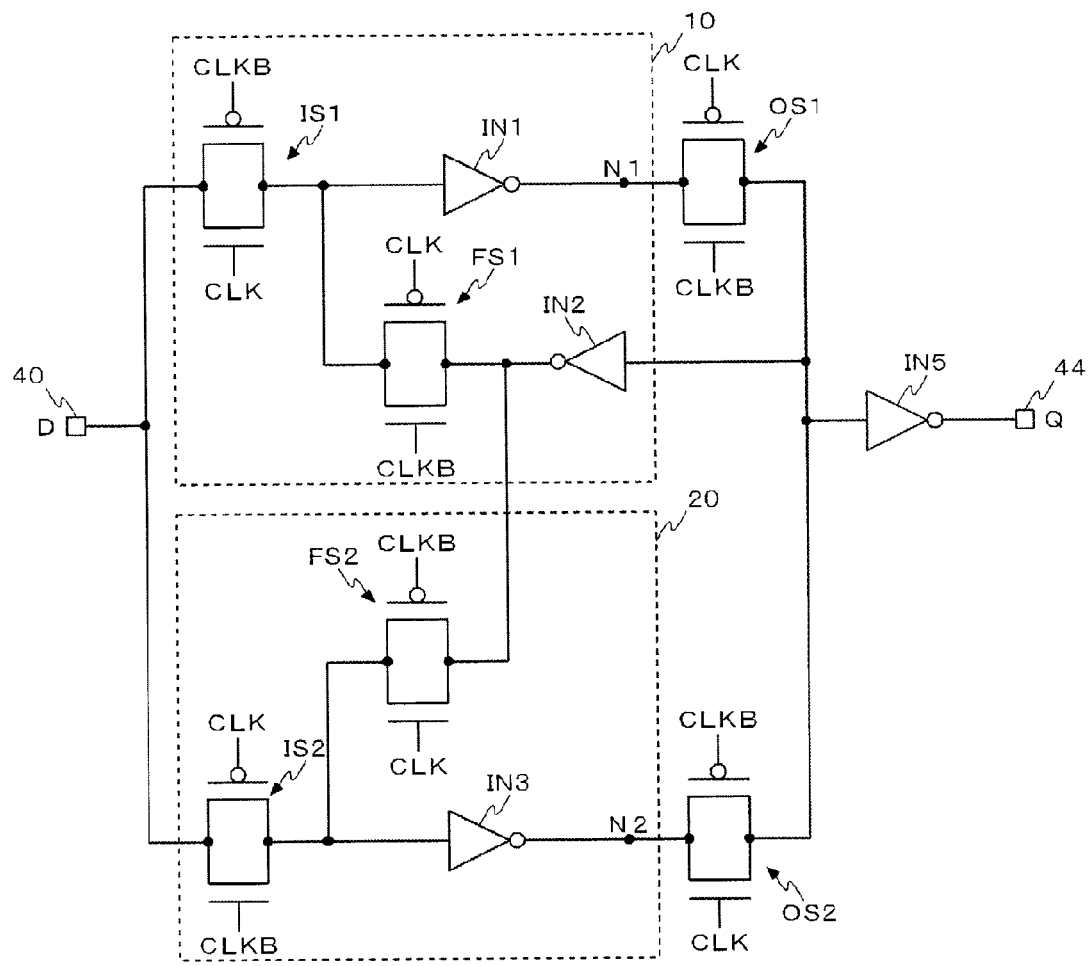
FIG. 5 is a circuit diagram showing a configuration of a double edge triggered flip-flop circuit according to a first embodiment of the present invention.

FIG. 5 is a circuit diagram showing a configuration of a double edge triggered flip-flop circuit 110 according to a first embodiment of the present invention. As compared with the flip-flop circuit 100 shown in FIG. 3, this flip-flop circuit 110 is configured such that a feedback inverter in the first latch circuit 10 and the second latch circuit 20 is shared. That is, the configuration is such that the second inverter IN2 and the fourth inverter IN4 as shown in FIG. 3 are put to common use and the fourth inverter IN4 is omitted.

The basic configuration of the flip-flop circuit 110 according to the first embodiment is similar to that of the flip-flop circuit 100 shown in FIG. 3. Hereinbelow, differences therefrom are described. The second latch circuit 20 includes a third inverter IN3, a second input switch IS2, and a second feedback switch FS2. When the second latch circuit 20 is in an active state, the second latch circuit 20 uses the second inverter IN2 included in the first latch circuit 10.

When the first latch circuit 10 is in an inactive state and the second latch circuit 20 is in an active state, the second inverter IN2 is cut off from the first inverter IN1 and then connected to the third inverter IN3. And the second inverter IN2 receives output data of the third inverter IN3, inverts the output data thereof and feeds back the inverted data to the input of the third inverter IN3. On the other hand, when the first latch circuit 10 is in an active state and the second latch circuit 20 is in an inactive state, the second inverter IN2 is cut off from the third inverter IN3 and then connected to the first inverter IN1. And the second inverter IN2 receives output data of the first inverter IN1, inverts the output data thereof and feeds back the inverted data to the input of the first inverter IN1.

The first output switch OS1 is provided between the output terminal of the first inverter IN1 and the input terminal of the second inverter IN2. The second output switch OS2 is provided between the output terminal of the third inverter IN3 and the input terminal of the second inverter IN2.

The operation of the flip-flop circuit 110 according the first embodiment is the same as that of the flip-flop circuit 100 shown in FIG. 3.

According to the first embodiment as described above, the circuit scale can be reduced in the double edge triggered flip-flop circuit. That is, as compared with the flip-flop circuit 100 shown in FIG. 3, a single inverter can be omitted while the same operation is achieved. Also, the power otherwise consumed by the inverter omitted can be reduced.

In the flip-flop circuit 100 as shown in FIG. 3, no switch is provided between the output terminal of the first inverter IN1 and the input terminal of the second inverter IN2, so that the connection between the first inverter IN1 and the second inverter IN2 cannot be electrically cut off. Thus, when the first latch circuit 10 is in an inactive state, the first inverter IN1 and the second inverter IN2 operate in synchronization with the input data D in the flip-flop circuit 100 shown in FIG. 3. In contrast thereto, in the flip-flop circuit 110 according to the first embodiment, the first output switch OS1 is provided between the output terminal of the first inverter IN1 and the input terminal of the second inverter IN2. Thus, when the first latch circuit 10 is in an inactive state, the second inverter IN2 is cut off by the first output switch OS1 and therefore the first inverter IN1 only operates in synchronization with the input data D in the flip-flop circuit 110 according to the first embodiment.

Thus, according to the first embodiment, when the first latch circuit 10 is in an inactive state, the number of transistor elements driven synchronously with the input data D can be reduced and therefore the power consumption can be reduced by as much as the reduced number of transistor elements. For example, if the second inverter IN2 is constituted by two transistors, the number of transistor elements driven synchronously with the input data D can be reduced by two in comparison with the flip-flop circuit 100. In particular, when the transition frequency of indefinite period of the input data D in FIG. 4 is high, the effect of reducing the power consumption due to the reduced number of transistor elements is larger. Note that the periods of input data D with the shaded areas in FIG. 4 indicate the indefinite periods.

Figure 6:
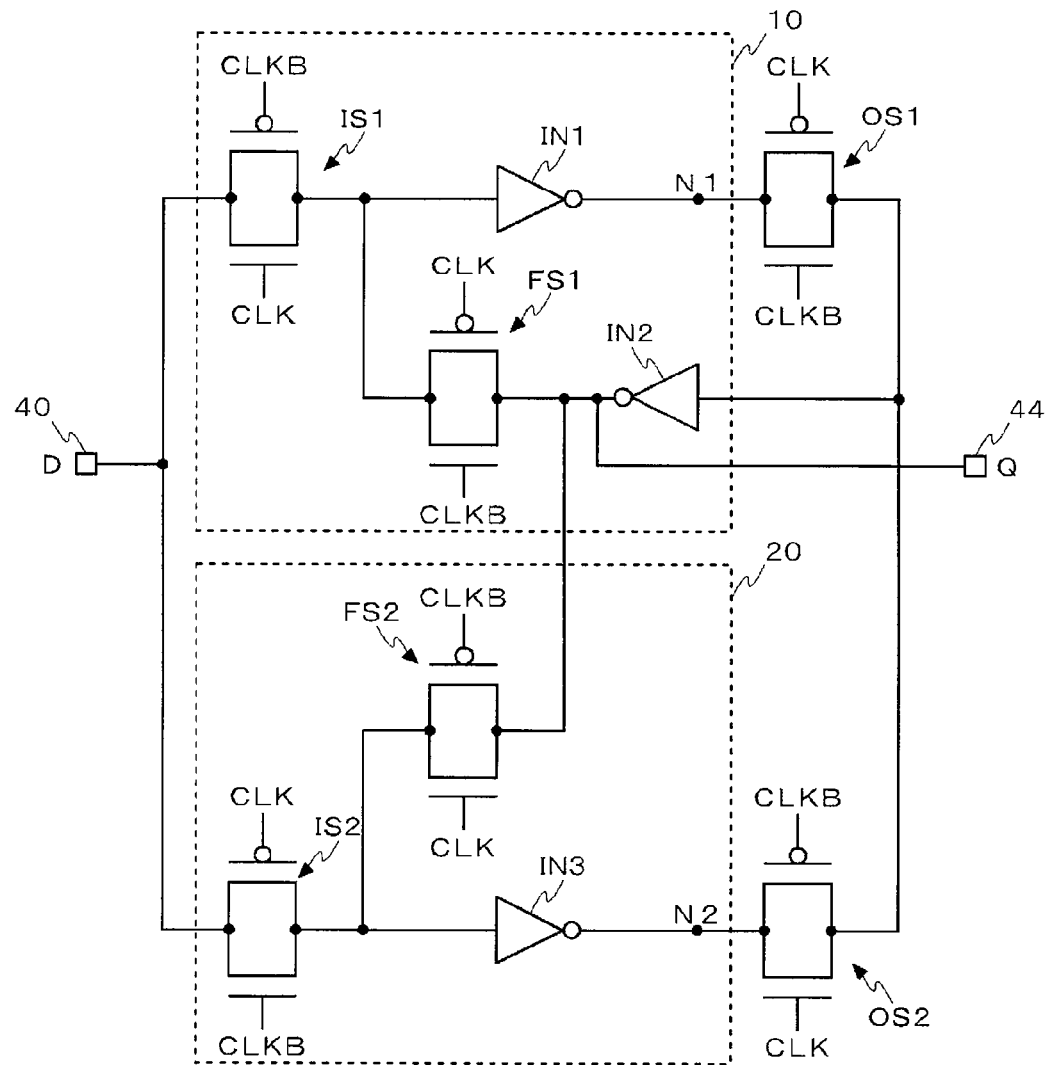
FIG. 6 is a circuit diagram showing a configuration of a double edge triggered flip-flop circuit according to a first modification of a first embodiment.

FIG. 6 is a circuit diagram showing a configuration of a double edge triggered flip-flop circuit 120 according to a first modification of the first embodiment. As compared with the flip-flop circuit 110 shown in FIG. 5, this flip-flop circuit 120 is configured such that the fifth inverter IN5 is omitted. Instead, the output data of this flip-flop circuit 120 are supplied from the output terminal of the second inverter IN2.

According to the first modification of the first embodiment as described above, the circuit scale can be reduced in the double edge triggered flip-flop circuit. That is, as compared with the flip-flop circuit 100 shown in FIG. 3, two inverters can be omitted while the same operation is achieved. Also, the power otherwise consumed by the inverters omitted can be reduced. However, as compared with the flip-flop circuit 110 shown in FIG. 5, the first feedback switch FS1, the second feedback switch FS2 and all elements placed subsequent thereto are driven by the output voltage of the second inverter IN2. In this regard, the subsequent elements in the flip-flop circuit 110 shown in FIG. 5 can be driven by the output voltage of the fifth inverter IN5, so that a flexible design can be realized. For instance, in order to improve the accuracy of the signal transition to subsequent stages it is possible to carry out a design such that the size of the fifth inverter IN5 is larger than that of the third inverter IN3. Similar to the case of the flip-flop circuit 110 shown in FIG. 5, provision of the first output switch OS1 between the output terminal of the first inverter IN1 and the input terminal of the second inverter IN2 brings about the advantageous effect.

Figure 7:
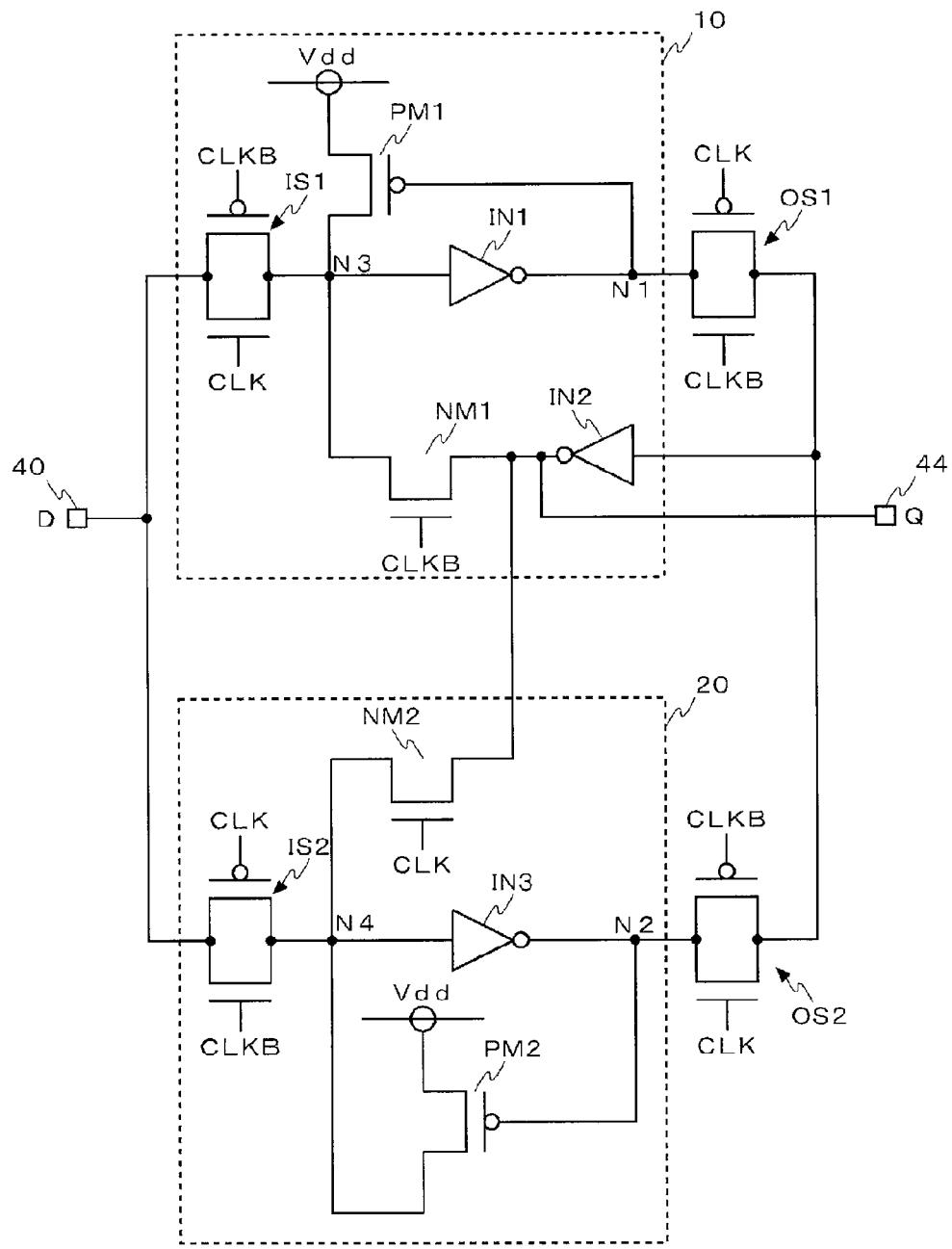
FIG. 7 is a circuit diagram showing a configuration of a double edge triggered flip-flop circuit according to a second modification of a first embodiment.

FIG. 7 is a circuit diagram showing a configuration of a double edge triggered flip-flop circuit 130 according to a second modification of the first embodiment. As compared with the flip-flop circuit 120 shown in FIG. 6, this flip-flop circuit 130 is configured such that a first Pch transistor PM1 and a second Pch transistor PM2 are added. And it is also configured such that the first feedback switch FS1 and the second feedback switch FS2, which is each a complementary switch, are replaced by a first Nch transistor NM1 and a second Nch transistor NM2.

The basic configuration of the flip-flop circuit 130 according to the second modification of the first embodiment is similar to that of the flip-flop circuit 120 shown in FIG. 6. Hereinbelow, differences therefrom are described.

The first latch circuit 10 further includes the first Pch transistor PM1. The first Pch transistor PM1 is provided between the input terminal of the first inverter IN1 and the power supply potential Vdd. The source terminal thereof is connected to the power supply potential Vdd; the drain terminal thereof is connected to the input terminal of the first inverter IN1; and the gate terminal thereof receives the output data of the first inverter IN1. The first feedback switch FS1 is configured not by a complementary switch but by the first Nch transistor NM1.

The second latch circuit 20 further includes the second Pch transistor PM2. The second Pch transistor PM2 is provided between the input terminal of the third inverter IN3 and the power supply potential Vdd. The source terminal thereof is connected to the power supply potential Vdd; the drain terminal thereof is connected to the input terminal of the third inverter IN3; and the gate terminal thereof receives the output data of the third inverter IN3. The second feedback switch FS2 is configured not by a complementary switch but by the second Nch transistor NM2.

Suppose that the first feedback switch FS1 and the second feedback switch FS2 are configured by the first Nch transistor NM1 and the second Nch transistor NM2, respectively. In this case, when the output data of the first inverter IN1 and the third inverter IN3 transit from a high level to a low level, namely, when the output data of the second inverter IN2 transit from a low level to a high level, the level of the input voltages of the first inverter IN1 and the third inverter IN3 is not sharp.

For that reason, according to the second modification, the output data of the first inverter IN1 and the third inverter IN3 are fed back to their respective inputs thereof via the first Pch transistor PM1 and the second Pch transistor PM2, respectively, when the output data of the first inverter IN1 and the third inverter IN3 transit from a high level to a low level. More specifically, when low levels are inputted to the gate terminals of the first Pch transistor PM1 and the second Pch transistor PM2, the first Pch transistor PM1 and the second Pch transistor PM2 conduct and then charge a third node N and a fourth node N4. On the other hand, when high levels are inputted to the gate terminals thereof, the first Pch transistor PM1 and the second Pch transistor PM2 shut off and then do not charge the third node N3 and the fourth node N4.

In other words, when the output data of the first inverter IN1 and the third inverter IN3 transit from a high level to a low level, the first Pch transistor PM1 and the second Pch transistor PM2 each functions as part of a feedback system. On the other hand, when the output data thereof transit from a low level to a high level, the first Nch transistor NM1 and the second Nch transistor NM2 each functions as part of a feedback system.

According to the second modification of the first embodiment as described above, the same effects as those of the first modification of the first embodiment are achieved. In addition to these effects, the following effect is achieved. That is, the number of MOS switches that charge and discharge the gate capacities by the clock signal CLK and the inverted clock signal CLKB can be reduced. More specifically, a complementary switch is constituted by two MOS switches, so that, in the first modification, twelve MOS switches are controlled by the clock signal CLK and the inverted clock signal CLKB. However, in the second modification, ten MOS switches are controlled by the clock signal CLK and the inverted clock signal CLKB.

Though two MOS switches, which are namely the first Pch transistor PM1 and the second Pch transistor PM2, are added in the second modification, those MOS switches are driven by the output data of the first inverter IN1 and the third inverter IN3. When the transition frequency of clock signal and the transition frequency of data are to be compared, the former is higher in general. Thus, the gate load of the MOS switches as a whole is reduced and therefore the power consumed by the flip-flop circuit 130 as a whole can be reduced.

Figure 8:
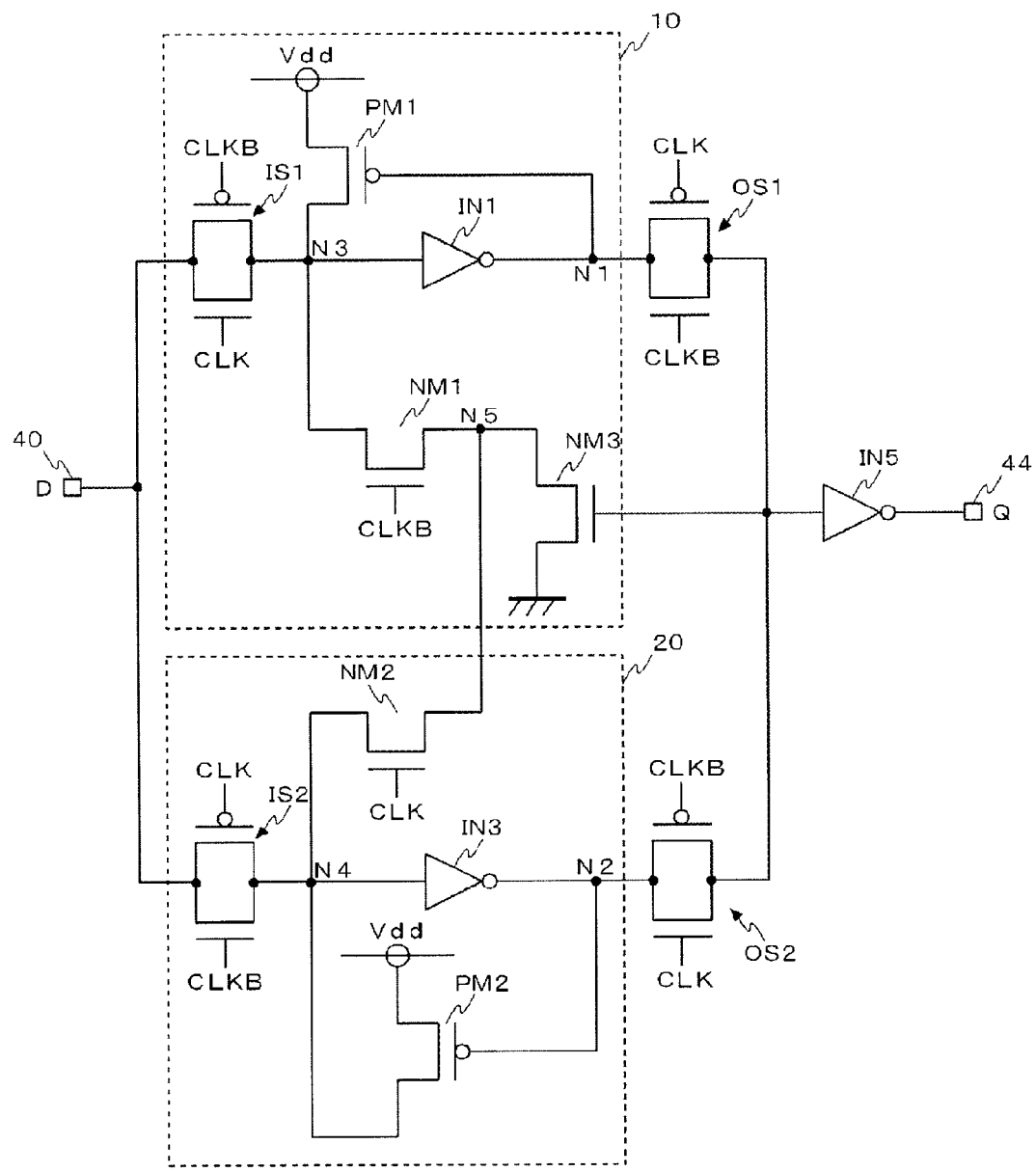
FIG. 8 is a circuit diagram showing a configuration of a double edge triggered flip-flop circuit according to a third modification of a first embodiment.

FIG. 8 is a circuit diagram showing a configuration of a double edge triggered flip-flop circuit 140 according to a third modification of the first embodiment. As compared with the flip-flop circuit 130 shown in FIG. 7, this flip-flop circuit 140 is configured such that the second inverter IN2 is replaced by a third Nch transistor NM3, and a fifth inverter IN5 is added.

The basic configuration of the flip-flop circuit 140 according to the third modification of the first embodiment is similar to that of the flip-flop circuit 130 shown in FIG. 7. Hereinbelow, differences therefrom are described.

The first latch circuit 10 includes a third Nch transistor NM3 in place of the second inverter IN2.

The source terminal of the third Nch transistor NM3 is connected to the ground potential; the drain terminal thereof is connected to the input terminals of the first inverter IN1 and the third inverter IN3 via the first Nch transistor NM1 and the second Nch transistor NM2, respectively; and the gate terminal thereof receives the output data of the first inverter IN1 and the third inverter IN3. When a high level is inputted to the gate terminal of the third Nch transistor NM3, the third Nch transistor NM3 becomes conductive and discharges the charge of a fifth node N5.

The fifth inverter IN5 is connected to the output terminals of the first inverter IN1 and the third inverter IN3 via the first output switch OS1 and the second output switch OS2, respectively. Note that a configuration may be employed wherein the fifth inverter IN5 is not provided and therefore the output voltage level of the fifth node N5 is the output data of this flip-flop circuit 140.

According to the third modification of the first embodiment as described above, the same effects as those of the second modification of the first embodiment are achieved. In addition to these effects, the following effect is achieved. That is, since the second inverter IN2 is replaced by the third Nch transistor NM3, the number of transistors can be reduced. This is because normally an inverter needs to be constituted by combining two or more transistors. Hence, the circuit scale and the power consumption can be further reduced in the third modification.

Figure 9:
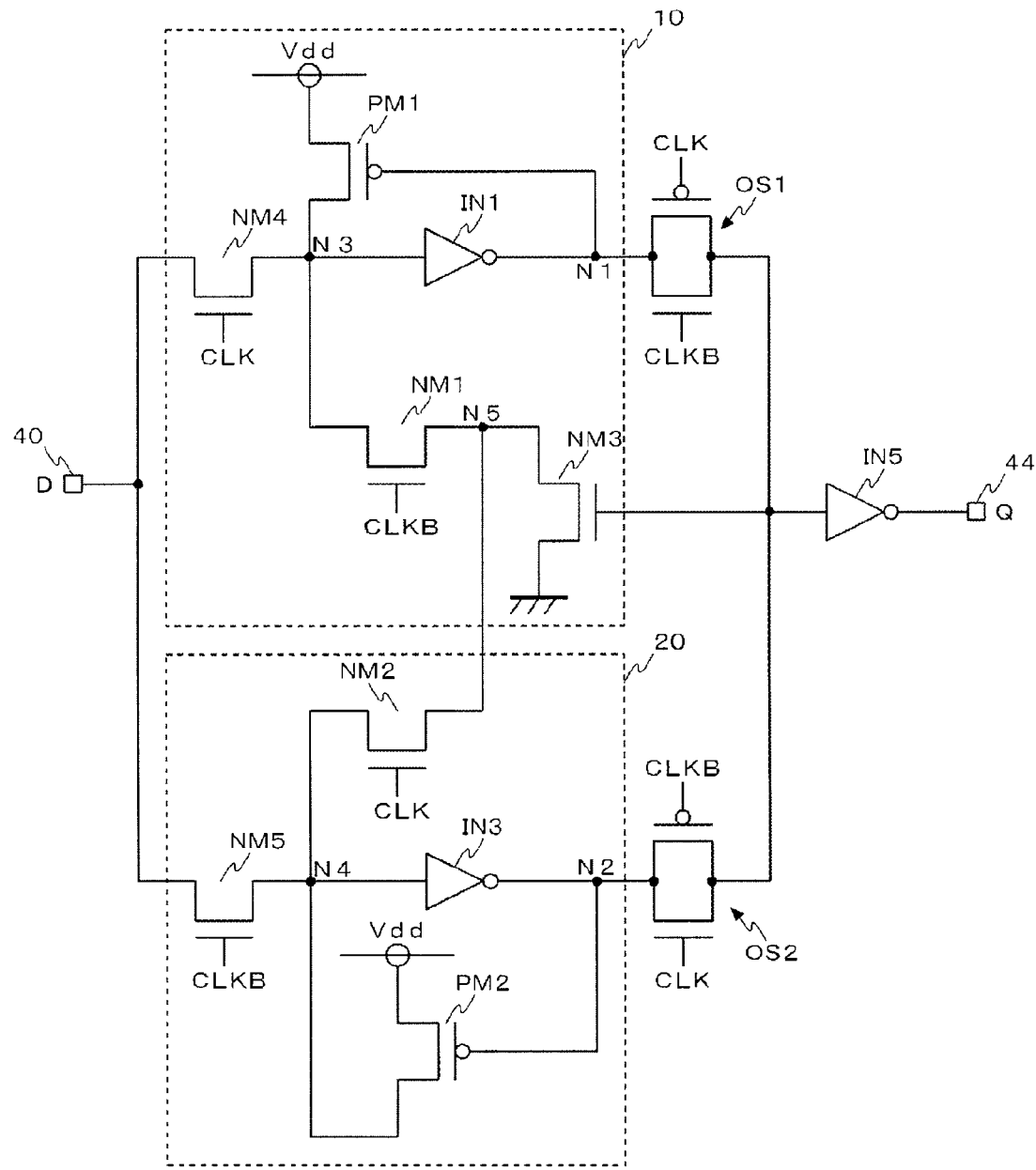
FIG. 9 is a circuit diagram showing a configuration of a double edge triggered flip-flop circuit according to a fourth modification of a first embodiment.

FIG. 9 is a circuit diagram showing a configuration of a double edge triggered flip-flop circuit 150 according to a fourth modification of the first embodiment. As compared with the flip-flop circuit 140 shown in FIG. 8, this flip-flop circuit 150 is configured such that the first input switch IS1 and the second input switch IS2, which are complementary switches, are replaced by a fourth Nch transistor NM4 and a fifth Nch transistor NM5, respectively.

In such a case where the first input switch IS1 and the second input switch IS2 are configured by the fourth Nch transistor NM4 and the fifth Nch transistor NM5, respectively, unsharp input data D are conveyed to a third node N3 and a fourth node N4 when the input data D transit from a low level to a high level. The third node N3 and the fourth node N4 are a node of a loop circuit configured by the first inverter IN1 and the first Pch transistor PM1 and a node of a loop circuit configured by the third inverter IN3 and the second Pch transistor PM2, respectively. Thus, at the point in time when the potentials of the third node N3 and the fourth node N4 exceed threshold voltages of the first inverter IN1 and the third inverter IN3, respectively, it can be said that each of the potentials thereof reaches a high level. Hence, the effect of the above-mentioned unsharpness can be significantly alleviated.

According to the fourth modification of the first embodiment as described above, the same effects as those of the third modification of the first embodiment are achieved. In addition to these effects, the following effect is achieved. That is, since the first input switch IS1 and the second input switch IS2, which are complementary switches, are replaced by the fourth Nch transistor NM4 and the fifth Nch transistor NM5, respectively, the number of transistors can be reduced. Hence, the circuit scale and the power consumption can be further reduced in the fourth modification.

Figure 10:
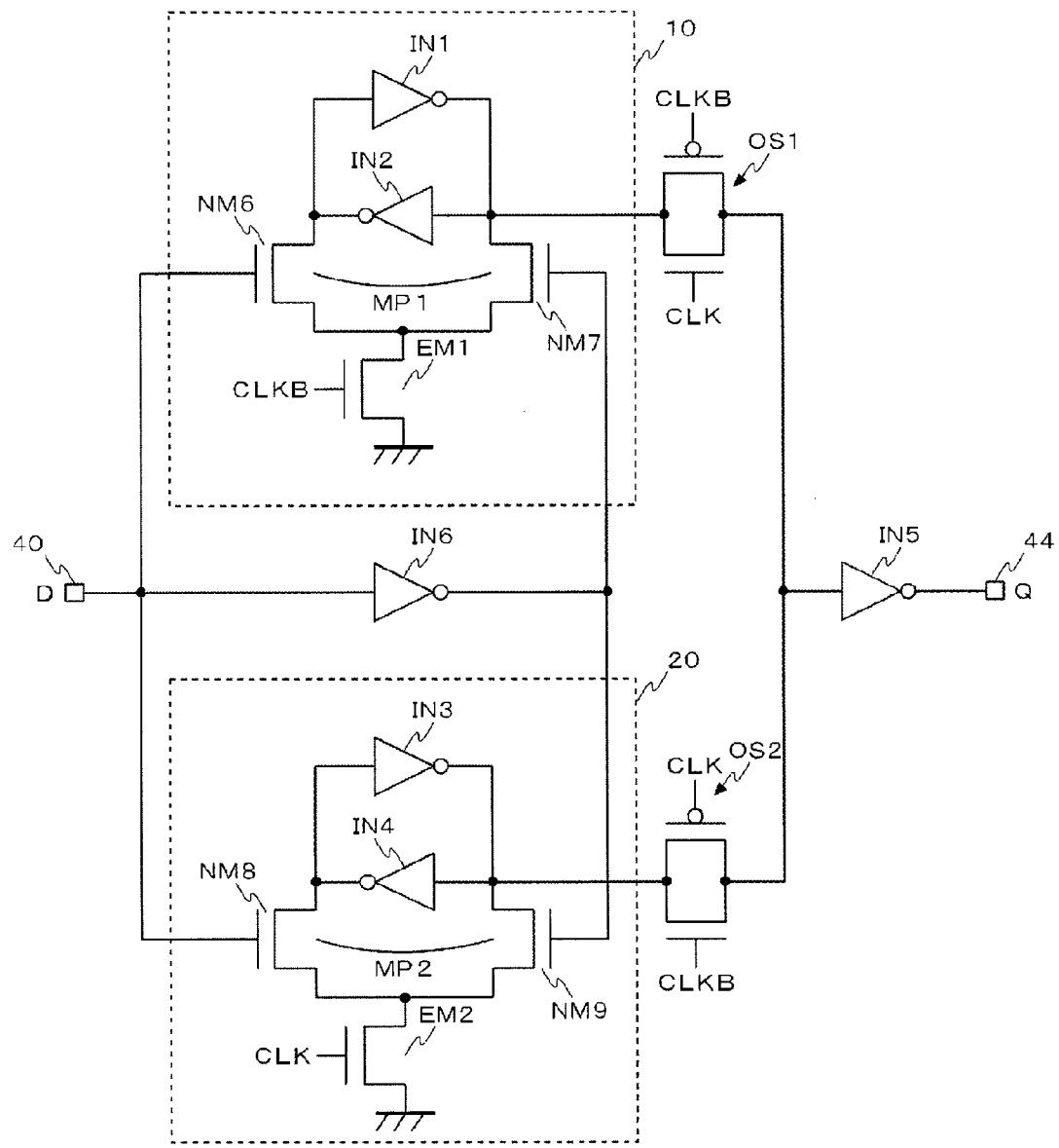
FIG. 10 is a circuit diagram showing a configuration of a double edge triggered flip-flop circuit according to a second embodiment of the present invention.

FIG. 10 is a circuit diagram showing a configuration of a double edge triggered flip-flop circuit 200 according to a second embodiment of the present invention. This flip-flop circuit 200 includes a first latch circuit 10, a second latch circuit 20, a first output switch OS1, a second output switch OS2, a fifth inverter IN5, and a sixth inverter IN6.

The first output switch OS1 is connected to the output terminal of the first latch circuit 10. The second output switch OS2 is connected to the output terminal 44 of the second latch circuit. The first output switch OS1 and the second output switch OS2 are each configured by a complementary switch comprised of a combination of N-channel transistors and P-channel transistors.

The sixth inverter IN6 receives input data D, inverts the input data D, and outputs the inverted input data D to both the first latch circuit 10 and the second latch circuit 20. The fifth inverter IN5 inverts the output data of the first latch circuit 10 and second latch circuit 20 and outputs the inverted output data. In the second embodiment, the output data of the first latch circuit 10 and the output data of the second latch circuit 20 have the same phase as that of the input data D. It goes without saying that the configuration without the provision of the fifth inverter IN5 is also possible.

The first latch circuit 10 latches the input data at either one of rising edge and falling edge of clock signal. The second latch circuit 20, which is provided in parallel with the first latch circuit 10, latches the input data at the other of either one of rising edge and falling edge of clock signal. At least one of the first latch circuit 10 and the second latch circuit 20 is configured by a SRAM type. In the following description, a description is given of an example where both the latch circuits are configured by the SRAM type. Note that either one of them may be configured by the latch circuit as described in the first embodiment or other latch circuits.

The first latch circuit 10 includes a first inverter IN1, a second inverter IN2, a first transistor pair M21, and a first activation transistor EM1. The first transistor pair MP1 is constituted by a sixth Nch transistor NM6 and a seventh Nch transistor NM7. The input data D are inputted to the gate terminal of the sixth Nch transistor NM6, whereas the output data of the sixth inverter IN6, namely the inverted data of the input data D, are inputted to the gate terminal of the seventh Nch transistor NM7. Thus, the sixth Nch transistor NM6 and the seventh Nch transistor NM7 turn on and off in a complementary manner.

The drain terminal of the sixth Nch transistor NM6 is connected to the input terminal of the first inverter IN1 and the output terminal of the second inverter IN2. The drain terminal of the seventh Nch transistor NM7 is connected to the input terminal of the second inverter IN2 and the output terminal of the first inverter IN1. The source terminal of the sixth Nch transistor NM6 and the source terminal of the seventh Nch transistor NM7 are connected in common.

In a conduction state, the first activation transistor EM1 activates the first transistor pair MP1. The first activation transistor EM1 is constituted by an Nch transistor, and the inverted clock signal CLKB is inputted to the gate terminal thereof. The source terminal thereof is connected to ground potential, and the drain terminal thereof is connected to the common source terminal of the first transistor pair MP1.

The first latch circuit 10 operates as follows. As the first transistor pair MP1 is activated, the first latch circuit 10 becomes inactive as a whole. As the first transistor pair MP1 is inactivated, the first latch circuit 10 becomes active as a whole.

More specifically, as the first activation transistor EM1 becomes conductive, the first transistor pair MP1 becomes active. In this state, either one of the sixth Nch transistor NM6 and the seventh Nch transistor NM7 that constitute the first transistor pair MP1 is conductive. The drain terminal voltage of the conductive transistor becomes a low level, whereas the input terminal voltage of either the first inverter IN1 or second inverter IN2 connected to the drain terminal thereof becomes a low level.

Even more specifically, when the input data D are in a high level, the sixth Nch transistor MN6 becomes conductive and the input terminal of the first inverter IN1 becomes a low level. As a result, the first inverter IN1 outputs a high level. When the input data D are in a low level, the seventh Nch transistor MN7 becomes conductive and then the second inverter IN2 outputs a high level and the first inverter IN1 outputs a low level. In this manner, the output of the first latch circuit 10 follows the input data D in-phase.

On the other hand, as the first activation transistor EM1 is cut off, the first transistor pair MP1 becomes inactive. In this state, the first inverter IN1 and the second inverter IN2 form a loop circuit, which latches the input data D during the inactivation of the first transistor pair MP1.

The second latch circuit 20 includes a third inverter IN3, a fourth inverter IN4, a second transistor pair MP2, and a second activation transistor EM2. The second transistor pair MP2 is constituted by an eighth Nch transistor NM8 and a ninth Nch transistor NM9. The configuration and operation of the second latch circuit 20 are the same as those of the first latch circuit 10 except for the fact that the signal inputted to the gate terminal of the second activation transistor EM2 is a clock signal CLK and therefore the repeated description thereof is omitted.

Based on the above explanation, an operation of the flip-clop circuit 200 as a whole will be described hereinbelow. When the first latch circuit 10 is controlled to remain in an active state and the second latch circuit 20 is controlled to remain in an inactive state, the first activation transistor EM1 and the second output switch OS2 are controlled to OFF and the second activation transistor EM2 and the first output switch OS1 are controlled to ON by the clock signal. On the other hand, when the first latch circuit 10 is controlled to remain in an inactive state and the second latch circuit 20 is controlled to remain in an active state, the first activation transistor EM1 and the second output switch OS2 are controlled to ON and the second activation transistor EM2 and the first output switch OS1 are controlled to OFF by the clock signal. The timing chart shown in FIG. 4 applies directly to a specific example of operation timing except for the fact that the output data of the first latch circuit 10 and the output data of the second latch circuit 20 have the same phase as that of the input data D.

According to the second embodiment as described above, the power consumption can be reduced in the double edge triggered flip-flop circuit. That is, as compared with the flip-flop circuit 100 shown in FIG. 3, the number of MOS switches that charge and discharge the gate capacities by the clock signal CLK and the inverted clock signal CLKB can be reduced while the same operation is achieved. As a result, the power for the charging and discharging of gate capacitances by clock signals can be reduced. The number of MOS switches can be reduced by six as compared with the flip-flop circuit 100 shown in FIG. 3.

Four MOS switches, which are namely the sixth Nch transistor NM6, the seventh Nch transistor NM7, the eighth Nch transistor NM8 and the ninth Nch transistor NM9, are added in the second embodiment. Those MOS switches are driven by the input data D or its inverted data. When the transition frequency of clock signal and the transition frequency of data are to be compared, the former is higher in general. Thus, the gate load of the MOS switches as a whole is reduced and therefore the power consumed by the flip-flop circuit 200 as a whole can be reduced.

A third embodiment is now described. The third embodiment relates to a clock control circuit that generates clock signals to be supplied to a double edge triggered flip-flop circuit where a period of non-use is set.

Figure 11:
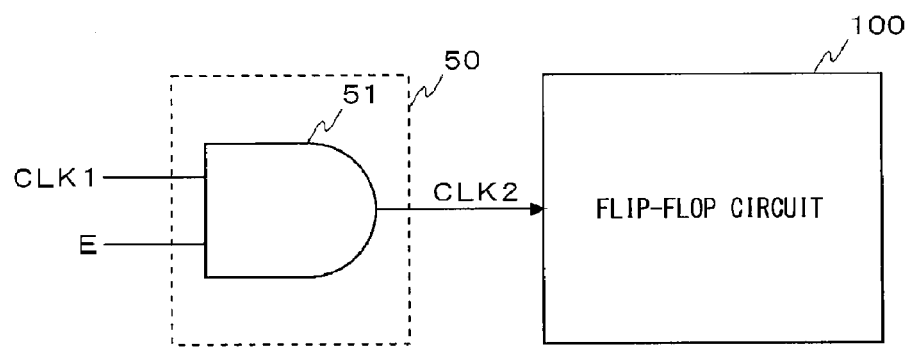
FIG. 11 is a block diagram showing a configuration of a commonly-used clock control circuit, for controlling clock signals to be supplied to a flip-flop circuit, and a semiconductor integrated apparatus that mounts the clock control circuit.

FIG. 11 is a block diagram showing a configuration of a commonly-used clock control circuit 50, for controlling clock signals to be supplied to a flip-flop circuit, and a semiconductor integrated apparatus 300 that mounts the clock control circuit 50. The semiconductor integrated apparatus 300 includes a clock control circuit 50 and a flip-flop circuit 100.

The flip-flop circuit 100 is a double edge triggered flip-flop circuit where the period of non-use is set. This flip-flop circuit 100 may have a configuration as shown by FIG. 3. However, the configuration thereof is not limited thereto and may be configured as in one of FIG. 5 to FIG. 10. Also, it is not limited to any of the above-described configurations and may be arbitrary as long as the configuration is of a double edge triggered flip-flop circuit where the period of non-use is set. Though a single flip-flop circuit 100 is shown in FIG. 11 for convenience, a circuit block containing a plurality of flip-flop circuits 100 may be controlled, as a single unit, by the output signal of the clock control circuit 50.

The clock control circuit 50 is constituted by an AND gate 51. The AND gate 51 receives a first clock signal CLK1 and an enable signal E and outputs a second clock signal CLK2. The second clock signal CLK2 is fed to the flip-flop circuit 100.

The first clock signal CLK1 may be a system clock or a clock generated by multiplying said system clock. It may be a signal that keeps the periodicity. The enable signal E indicates the usage status of the above-described flip-flop circuit 100. For instance, the enable signal E outputs a significant signal for a period during which this flip-flop circuit 100 is in use, and outputs a nonsignificant signal for a period during which it is not in use. Here, the period during which it is not in use may be a standby period. In the following description, the significant signal is a high level and the nonsignificant signal a low level though they may be set the other way around.

Figure 12:
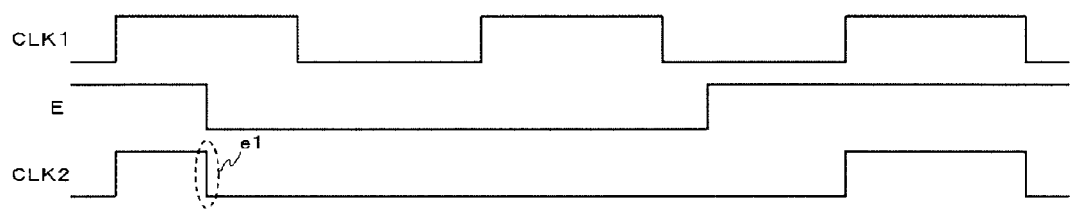
FIG. 12 is a timing chart showing an exemplary operation of the clock control circuit shown in FIG. 11.

FIG. 12 is a timing chart showing an exemplary operation of the clock control circuit shown 50 in FIG. 11. The clock control circuit 50 is constituted by an AND gate 51. Thus, when the enable signal E is in a high level, the first clock signal CLK1 is outputted from the AND gate 51 as it is; and when the enable signal E is in a low level, the low level is outputted from the AND gate 51. As a result, the transition of the second clock signal CLK2 can be suspended for a period during which the flip-flop circuit 100 is not in use.

Referring to FIG. 12, at a falling edge when the enable signal E transits from a high level to a low level, the second clock signal CLK2 also transits from a high level to a low level. This edge e1 is an unnecessary transition. In other words, there is no need to change the data held by the flip-flop circuit 100 when the flip-flop circuit 100 transits to the period of non-use. Instead, the flip-flop circuit 100 shall hold said data during the period of non-use, and resume the operation from the data holding state when the period returns to a period of use.

Though the falling edge of clock signal is not used as a trigger in the single edge triggered flip-flop circuit as shown in FIG. 2, the falling edge of clock signal is used also as a trigger in the double edge triggered flip-flop circuit. Hence, the content of data held in the flip-flop circuit 100 will be updated by the falling edge e1 of the second clock signal CLK2, thereby possibly causing malfunction when the period returns to the period of use.

Figure 13:
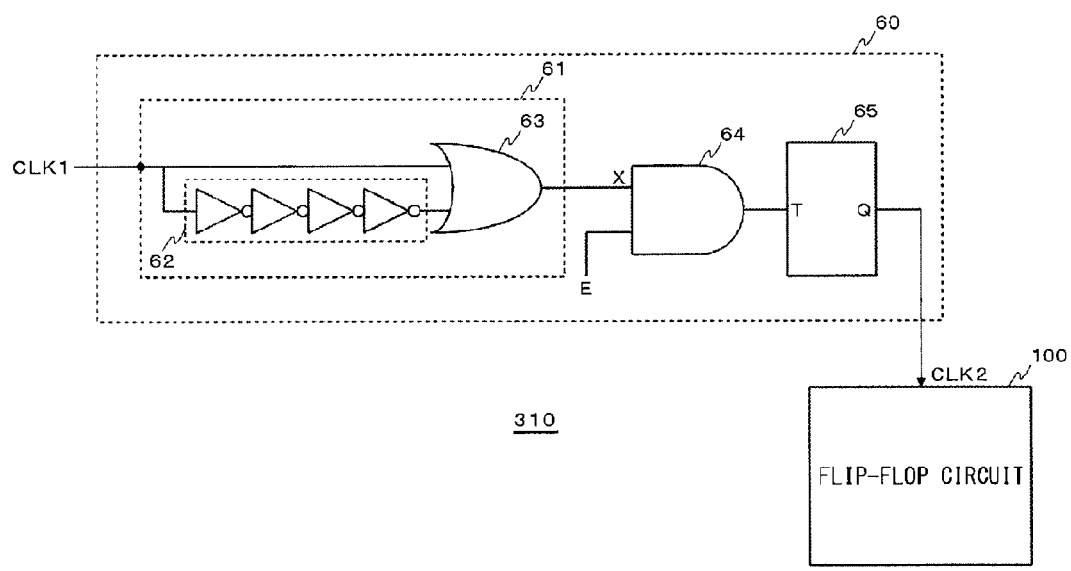
FIG. 13 is a block diagram showing a configuration of a clock control circuit, for controlling clock signals to be supplied to a flip-flop circuit, according to a third embodiment and a semiconductor integrated apparatus that mounts this clock control circuit.

FIG. 13 is a block diagram showing a configuration of a clock control circuit 60, for controlling clock signals to be supplied to a flip-flop circuit, according to a third embodiment of the present invention and a semiconductor integrated apparatus 310 that mounts this clock control circuit. The semiconductor integrated apparatus 310 includes a clock control circuit 60 and a flip-flop circuit 100. The clock control circuit 60 includes an edge detection circuit 61, an AND gate 64, and a T-type flip-flop circuit 65.

The edge detection circuit 61 receives the first clock signal CLK1. Upon detection of an edge thereof, the edge detection circuit 61 outputs a pulse signal of predetermined width to the AND gate 64. Here, edges to be detected are both the rising edge and the falling edge.

The edge detection circuit 61 is constituted by a delay circuit 62 and an XOR gate 63, for instance. The delay circuit 62 delays the first clock signal CLK1 for a predetermined time period and then outputs it to the XOR gate 63. The delay circuit 62 may be structured such that an even number of inverters are cascade-connected. The width of the above-mentioned pulse signal can be adjusted by adjusting this number of stages of inverters. The XOR gate 63 receives the output signal of the delay circuit 62 and the first clock signal CLK1, and outputs the computation result to the AND gate 64. This computation result is a pulse signal of predetermined width generated every time the edge of first clock signal CLK1 is detected.

The AND gate 64 receives the output signal of the edge detection circuit 61 and the enable signal E. And for a period during which the enable signal E is significant, the AND gate 64 outputs a signal, which follows the output signal of the edge detection circuit 61, to the T-type flip-flop circuit 65. For a period during which the enable signal E is nonsignificant, the AND gate 64 outputs a signal of nonsignificant level to the T-type flip-flop circuit 65. More specifically, the AND gate 64 outputs directly the output signal of the edge detection circuit 61 for a period during which the enable signal E is in a high level, whereas it outputs a low level for a period during which the enable signal E is in a low level.

The T-type flip-flop circuit 65 receives the output signal of the AND gate 64. And the T-type flip-flop circuit 65 outputs a signal, whose logic level is inverted, to the double edge triggered flip-flop circuit 100 every time a pulse signal of predetermined width is detected.

Figure 14:
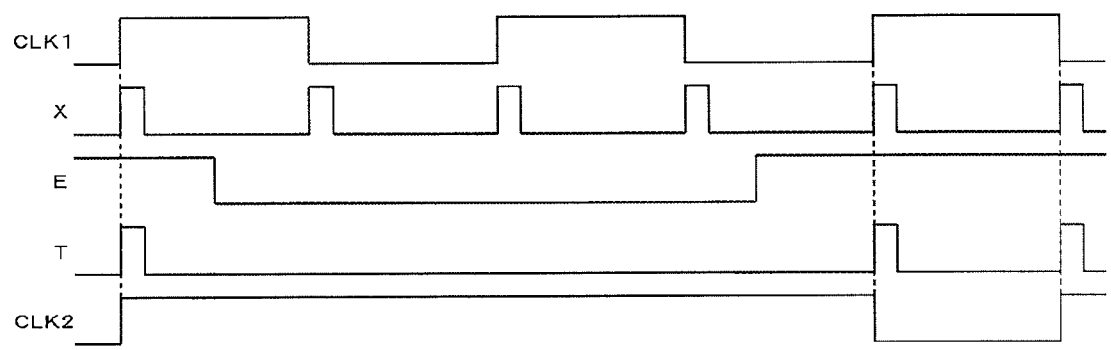
FIG. 14 is a timing chart showing an exemplary operation of a clock control circuit according to a third embodiment.

FIG. 14 is a timing chart showing an exemplary operation of the clock control circuit according to the third embodiment. The XOR gate 63 outputs a low level if the logic levels of two input signals are the same, whereas the XOR gate 63 outputs a high level if the logic levels thereof differ. Thus, since the logic levels of the two input signals become the same after a delay period of the delay circuit 62 has elapsed, the XOR gate 63 outputs a low level. Hence, a pulse signal of predetermined width is generated as an output signal of the XOR gate 63 every time the edge of first clock signal CLK1 is detected.

For a period during which the enable signal E is in a low level, the AND gate 64 masks the output signal of the XOR gate 63. T-type flip-flop circuit 65 inverts the logic level of the output signal of the T-type flip-flop circuit 65 itself at rising edge of the output signal of the AND gate 64 and maintains the logic level of the output signal thereof at falling edge of the output signal of the AND gate 64. Thus, when one such pulse signal as described above is detected, the logic level of said output signal is inverted once in the T-type flip-flop circuit 65.

Comparing FIG. 14 with FIG. 12, it is found that no useless edge e1 occurs in FIG. 14. Note that the phase of the second clock signal CLK2 is reverse to that of the first clock signal CLK1 after the flip-flop circuit 100 has been restored to an active state from an inactive state. In view of this, the data D latched in the first latch circuit 10 and the second latch circuit 20 are merely interchanged with each other in the double edge triggered flip-flop circuit 100. Thus, the output signal of the flip-flop circuit 100 is the same even if it is latched by either one of the first latch circuit 10 and the second latch circuit 20 as long as their respective latching timings are the same.

According to the third embodiment as described above, when the clock signal to be supplied to the double edge triggered flip-flop circuit where a period of non-use is set is generated, the malfunction of this flip-flop circuit can be suppressed with a simple configuration. That is, for a period during which the enable signal E is significant, the second clock signal CLK2 transits in synchronization with the edge detection of the first clock signal CLK1. On the other hand, when the enable signal E transits to a nonsignificant level, the second clock signal CLK2 maintains the immediately preceding logic level thereof.

As a result, the unnecessary transition of logic level of the second clock signal CLK2 due to the transition of logic level of the enable signal E is suppressed and therefore the malfunction of the flip-flop circuit 100 can be prevented.

Another method is available where the logic level of the second clock signal CLK2 at the time the supply of the second clock signal CLK2 stops and the logic level of the first clock signal CLK1 at the time the supply thereof resumes are compared with each other and then the phase of said second clock signal CLK2 is controlled in accordance with the result of the comparison. However, this method requires the storage of the logic level of said second clock signal CLK2 at the time the supply of the second clock CLK2 stops, thus increasing the circuit area.

In contrast to this, there is no need to store said logic level in the third embodiment. Thus the circuit configuration can be simplified. Also, for a period during which the enable signal E is significant, the clock control circuit 60 according to the third embodiment is based on a simple algorithm that merely inverts the logic level of the second clock signal CLK2 every time the edge of the first clock signal CLK1 is detected. Hence, the malfunction in the clock control circuit 60 is suppressed and the highly reliable second clock signal CLK2 can be generated.

The above-described embodiments are intended to be illustrative only and it will be obvious to those skilled in the art that various other modifications to a combination of constituting elements and processes could be developed and that such modifications are also within the scope of the present invention.

Although in the first embodiment a description is given of an example where the Nch transistor is used in place of the complementary switch, the Pch transistor may be used instead of the Nch transistor. In such a case, the signal inputted to the gate terminal may be changed to the inverted clock signal CLKB from the clock signal CLK or changed to the clock signal CLK from the inverted clock signal CLKB, as appropriate.

Each of the logic gate explained in the third embodiment is replaceable as appropriate if each of them is a logic gate having the same truth table.

Lastly, still another embodiments are appended as follows.
(Item 1)
A clock control circuit for generating a second clock signal, used to control a double edge triggered flip-flop circuit where a period of non-use is set, from a predetermined first clock signal, the clock control circuit comprising:
an edge detection circuit which receives the first clock signal and, upon detection of an edge of the first clock signal, outputs a pulse signal of predetermined width;
a logical gate which receives an output signal of said edge detection circuit and an enable signal indicating a usage state of the double edge triggered flip-flop circuit and which outputs a signal that follows the output signal of said edge detection circuit for a period during which the enable signal is significant and outputs a signal of nonsignificant level for a period during which the enable signal is nonsignificant; and
a toggle type flip-flop circuit which receives an output signal of said logic gate and outputs a signal, whose logic level is inverted, as the second clock signal every time the pulse signal of predetermined width is detected.
(Item 2)
A clock control circuit according to Item 1, wherein said edge detection circuit includes:
a delay circuit which delays the first clock signal for a predetermined period and outputs it; and
an XOR gate which receives an output signal of the delay circuit and the first clock signal and outputs a signal containing the pulse signal of predetermined width.
(Item 3)
A semiconductor integrated apparatus, comprising:
a clock control circuit according to Item 1 or Item 2; and
a double edge triggered flip-flop circuit which receives the second clock signal generated by the clock control circuit wherein a period of non-use is set in said double edge triggered flip-flop circuit.

While the preferred embodiments of the present invention and the modifications to the embodiments have been described using specific terms, such description is for illustrative purposes only, and it is to be understood that changes and variations may be further made without departing from the spirit or scope of the appended claims.

What is claimed is:
1. A flip-flop circuit, comprising:
a first latch circuit which latches input data at one of a rising edge and a falling edge of a clock signal; and
a second latch circuit, provided in parallel with said first latch circuit, which latches the input data at the other one of the rising edge and the falling edge of the clock signal,
wherein at least one of said first latch circuit and said second latch circuit includes:
a transistor pair to which the input data and inverted data thereof are inputted; and
an activation transistor which activates the transistor pair in a conduction state.
2. A flip-flop circuit, comprising:
a first latch circuit which latches input data at one of a rising edge and a falling edge of a clock signal;
a second latch circuit, provided in parallel with said first latch circuit, which latches the input data at the other one of the rising edge and the falling edge of the clock signal;
a first output switch connected to an output terminal of said first latch circuit; and
a second output switch connected to an output terminal of said second latch circuit,
said first latch circuit including:
a first transistor pair to which the input data and inverted data thereof are inputted; and
a first activation transistor which activates the first transistor pair in a conduction state,
said second latch circuit including:
a second transistor pair to which the input data and inverted data thereof are inputted; and
a second activation transistor which activates the second transistor pair in a conduction state,
wherein when said first latch circuit is controlled to maintain an active state where the latched data are retained and said second latch circuit is controlled to maintain an inactivate state that follows the input data, the first activation transistor and said second output switch are con- trolled to OFF and the second activation transistor and said first output switch are controlled to ON by the clock signal, and wherein when said first latch circuit is controlled to maintain the inactive state and said second latch circuit is controlled to maintain the activate state, the first activation transistor and said second output switch are controlled to ON and the second activation transistor and said first output switch are controlled to OFF by the clock signal.

3. A flip-flop circuit according to claim 2, wherein said first output switch and said second output switch are each configured by a complementary switch where an N-channel transistor and a P-channel transistor are combined, and wherein the first activation transistor and the second activation transistor are each configured by a single transistor.

4. A flip-flop circuit, comprising:
a first latch circuit which latches input data at one of a rising edge and a falling edge of a clock signal; and
a second latch circuit, provided in parallel with said first latch circuit, which latches the input data at the other one of the rising edge and the falling edge of the clock signal,
said first latch circuit including:
a first inverter which receives the input data, inverts the input data and outputs the inverted data; and
a second inverter which receives output data of the first inverter, inverts the output data thereof, and feeds back the inverted data to an input of the first inverter,
said second latch circuit including:
a third inverter which receives the input data, inverts the input data and outputs the inverted data,
wherein when said first latch circuit is in an inactive state that follows the input data and said second latch circuit is in an active state where the latched data are retained, the second inverter is cut off from the first inverter and connected to the third inverter, and
the second inverter receives output data of the third inverter, inverts the output data thereof and feeds back the inverted data to an input of the third inverter.

5. A flip-flop circuit according to claim 4, further comprising a first output switch provided between an output terminal of the first inverter and an input terminal of the second inverter; and
a second output switch provided between an output terminal of the third inverter and an input terminal of the second inverter,
said first latch circuit further including:
a first input switch connected to an input terminal of the first inverter; and
a first feedback switch provided between an output terminal of the second inverter and the input terminal of the first inverter,
said second latch circuit further including:
a second input switch connected to an input terminal of the third inverter; and
a second feedback switch provided between the output terminal of the second inverter and the input terminal of the third inverter,
wherein when said first latch circuit is controlled to maintain the active state and said second latch circuit is controlled to maintain the inactive state, the first input switch, said second output switch and the second feedback switch are controlled to OFF and the second input switch, said first output switch and the first feedback switch are controlled to ON by the clock signal, and wherein when said first latch circuit is controlled to maintain the inactive state and said second latch circuit is controlled to maintain the activate state, the first input switch, said second output switch and the second feedback switch are controlled to ON and the second input switch, said first output switch and the first feedback switch are controlled to OFF by the clock signal.

6. A flip-flop circuit according to claim 5, further comprising a first P-channel transistor, provided between the input terminal of the first inverter and a high-potential-side fixed voltage source, wherein a gate terminal of said first P-channel transistor receives output data of the first inverter; and
a second P-channel transistor, provided between the input terminal of the third inverter and the high-potential-side fixed voltage source, wherein a gate terminal of said second P-channel transistor receives output data of the third inverter.

7. A flip-flop circuit according to claim 5, wherein the first input switch, the second input switch, said first output switch and said second output switch are each configured by a complementary switch where an N-channel transistor and a P-channel transistor are combined.

8. A flip-flop circuit according to claim 6, wherein the first input switch, the second input switch, said first output switch and said second output switch are each configured by a complementary switch where an N-channel transistor and a P-channel transistor are combined.

9. A flip-flop circuit according to any one of claim 5, wherein the first feedback switch and the second feedback switch are each configured by an N-channel transistor.

10. A flip-flop circuit according to any one of claim 6, wherein the first feedback switch and the second feedback switch are each configured by an N-channel transistor.

11. A flip-flop circuit according to any one of claim 4, wherein output data of the second inverter is output data of the flip-flop circuit.

12. A flip-flop circuit according to any one of claim 5, wherein output data of the second inverter is output data of the flip-flop circuit.

13. A flip-flop circuit according to any one of claim 6, wherein output data of the second inverter is output data of the flip-flop circuit.

14. A flip-flop circuit, comprising:
a first latch circuit which latches input data at one of a rising edge and a falling edge of a clock signal; and
a second latch circuit, provided in parallel with said first latch circuit, which latches the input data at the other one of the rising edge and the falling edge of the clock signal,
said first latch circuit including:
a first inverter which receives the input data, inverts the input data and outputs the inverted data;
a first P-channel transistor, provided between an input terminal of the first inverter and a high-potential-side fixed voltage source, wherein a gate terminal of the first P-channel transistor receives output data of the first inverter; and
an N-channel transistor, provided between the input terminal of the first inverter and a low-potential-side fixed voltage source, wherein a gate terminal of the N-channel transistor receives the output data of the first inverter,
said second latch circuit including:
a third inverter which receives the input data, inverts the input data and outputs the inverted data; and
a second P-channel transistor, provided between an input terminal of the third inverter and the high-potential-side fixed voltage source, wherein a gate terminal of the second P-channel transistor receives output data of the third inverter, wherein when said first latch circuit is in an inactive state that follows the input data and said second latch circuit is in an active state where the latched data are retained, the N-channel transistor is cut off from the first inverter, a drain terminal thereof is connected to an input terminal of the third inverter and the gate terminal thereof receives the output data of the third inverter.

15. A flip-flop circuit according to claim 14, further comprising a first output switch provided between an output terminal of the first inverter and the gate terminal of the N-channel transistor; and a second output switch provided between an output terminal of the third inverter and the gate terminal of the N-channel transistor, said first latch circuit further including:

a first input switch connected to the input terminal of the first inverter; and a first feedback switch provided between the drain terminal of the N-channel transistor and the input terminal of the first inverter, said second latch circuit further including:

a second input switch connected to the input terminal of the third inverter; and a second feedback switch provided between the drain terminal of the N-channel transistor and the input terminal of the third inverter, wherein when said first latch circuit is controlled to maintain the active state and said second latch circuit is controlled to maintain the inactivate state, the first input switch, said second output switch and the second feedback switch are controlled to OFF and the second input switch, said first output switch and the first feedback switch are controlled to ON by the clock signal, and wherein when said first latch circuit is controlled to maintain the inactive state and said second latch circuit is controlled to maintain the activate state, the first input switch, said second output switch and the second feedback switch are controlled to ON and the second input switch, said first output switch and the first feedback switch are controlled to OFF by the clock signal.

16. A flip-flop circuit according to claim 15, wherein the first input switch and the second input switch are each configured by a single transistor.

* * * * *